(12) United States Patent
Ishii et al.

(10) Patent No.: US 7,948,242 B2
(45) Date of Patent: May 24, 2011

(54) INTEGRATED CIRCUIT AND INTEGRATED CIRCUIT PACKAGE

(75) Inventors: Masahiro Ishii, Hyogo (JP); Toshiroh Nishio, Osaka (JP)

(73) Assignee: Panasonic Corporation, Osaka (JP)

( * ) Notice: Subject to any disclaimer, the term of this patent is extended or adjusted under 35 U.S.C. 154(b) by 1076 days.

(21) Appl. No.: 11/665,059

(22) PCT Filed: Oct. 28, 2005

(86) PCT No.: PCT/JP2005/019861
§ 371 (c)(1),
(2), (4) Date: Apr. 11, 2007

(87) PCT Pub. No.: WO2006/049090
PCT Pub. Date: May 11, 2006

(65) Prior Publication Data
US 2009/0027058 A1    Jan. 29, 2009

(30) Foreign Application Priority Data
Nov. 4, 2004    (JP) ................. 2004-320202

(51) Int. Cl.
*G01R 31/02* (2006.01)
(52) U.S. Cl. .................. 324/537; 324/762.02
(58) Field of Classification Search .............. 324/537, 324/765, 500, 523, 527, 539, 543, 762.01, 324/762.02, 555
See application file for complete search history.

(56) References Cited

U.S. PATENT DOCUMENTS

| | | | |
|---|---|---|---|
| 5,687,015 A * | 11/1997 | Abe | ............ 370/503 |
| 5,717,695 A | 2/1998 | Manela et al. | |
| 6,442,668 B2 | 8/2002 | Sudo | |
| 6,686,755 B2 * | 2/2004 | White et al. | ........... 324/763 |
| 2002/0026553 A1 | 2/2002 | Saito | |

FOREIGN PATENT DOCUMENTS
JP    11-44663    2/1999
(Continued)

OTHER PUBLICATIONS
http://dossier1.ipdl.inpit.go.jp/AIPN/odse_call_transl.
(Continued)

*Primary Examiner* — Hoai-An D Nguyen
(74) *Attorney, Agent, or Firm* — Wenderoth, Lind & Ponack L.L.P.

(57) ABSTRACT

An integrated circuit includes a monitoring-target circuit portion 1200 and a debugging circuit portion 1100. The debugging circuit portion 1100 acquires a signal on a signal line of the monitoring-target circuit portion 1200 and transmits the acquired signal to an external device 2000 by radio. The debugging circuit portion 1100 includes a setting unit 1120 and a radio transmitter 1140. In order to monitor the monitoring-target circuit portion 1200, the setting unit 1120 sets an isolation unit 1300 so as to make electrical connection between the debugging circuit portion 1100 and the monitoring-target circuit portion 1200. In addition, the setting unit 1120 sets a selector 1130 to select a signal line 1131 specified as a monitoring target. The radio transmitter 1140 acquires a signal on the signal line selected by the selector 1130 and transmits the acquired signal to the external device 2000 by radio.

8 Claims, 7 Drawing Sheets

FOREIGN PATENT DOCUMENTS

| | | |
|---|---|---|
| JP | 11-161524 | 6/1999 |
| JP | 2002-24201 | 1/2002 |
| JP | 2003-57300 | 2/2003 |
| JP | 2004-110629 | 1/2004 |
| JP | 2005-18703 | 1/2005 |

OTHER PUBLICATIONS ipdl?N0000=7413&N0005=Ei7BzenZVnBvfz7D1ZIK&N0120=01&N2001=2&N3001=2003-057300&Ntt3=computerV13& Ntt4=electronicsV13&Ntt5=gakujutsuV13&Ntt6=&Ntt7=&Ntt8=&Ntt9=&Ntt10=&Ntt11=&Ntt12= : English translation produced by machine translation for JP 2003-057300 A.* http://dossier1.ipdl.inpit.go.jp/AIPN/odse_call_transl.ipdl?N0000=7413&N0005=Ei7BzenZVnBvfz7D1ZIK&N0120=01&N2001=2&N3001=2004-110629&Ntt3=computerV13& Ntt4=electronicsV13&Ntt5=gakujutsuV13&Ntt6=&Ntt7=&Ntt8=&Ntt9=&Ntt10=&Ntt11=&Ntt12=: English translation produced by machine translation for JP 2004-110629 A.*

* cited by examiner

US 7,948,242 B2

INTEGRATED CIRCUIT AND INTEGRATED CIRCUIT PACKAGE

TECHNICAL FIELD

The present invention relates an integrated circuit having a plurality of circuits interconnected by a bus. The present invention also relates to an integrated circuit package having the integrated circuit. More particularly, the present invention relates to a technique of monitoring the internal state of the integrated circuit.

BACKGROUND ART

With the recent advances in manufacturing of integrated circuits, it is now common that electronic products, such as mobile phones and home appliances, incorporate integrated circuit packages having high-performance CPUs and large-capacity memories.

The size of an integrated circuit or package is determined by the number of input and output terminals for exchanging electronic signals between the integrated circuit and an external device. An increase in the number of I/O terminals will cause disadvantages, such as an increase in circuit area and in cost. Especially in the case of integrated circuits for incorporation into compact electronic products such as mobile phones, the smaller circuit area is desirable. Consequently, the number of I/O terminals needs to be limited.

Further, some recently available integrated circuit packages include a debugging circuit for debugging errors of the integrated circuit. Such a debugging circuit is capable of monitoring signals on the bus and outputting the signals to the outside of the integrated circuit.

Patent Document 1 describes an analyzing device that causes the internal state of an integrated circuit to be output to the outside and analyzed. More specifically, the analyzing device performs a monitoring phase and an I/O phase by the time sharing. In the monitoring phase, the internal state of the integrated circuit is output to the outside via one or more predetermined terminals. In the I/O phase, electronic signals are input from and output to the outside via each predetermined terminal.

Patent Document 1

PROBLEMS THE INVENTION IS ATTEMPTING TO SOLVE

According to the technique disclosed in Patent Document 1, the internal state of an integrated circuit is output via one or more predetermined terminals that are also used for input and output of signals between the integrated circuit and an external device. Thus, the number of terminals required for implementing monitoring of the internal state can be reduced to some extent.

Unfortunately, however, it is expected that integrated circuits become more and more sophisticated and thus more and more components need to be monitored. In such a case, the internal state of numerous monitoring targets needs to be output using the predetermined terminal(s) by time sharing. It is naturally anticipated that sufficient information cannot be obtained without increasing the number of terminals used for monitoring.

The present invention aims to provide, without employing the technique of Patent Document 1, an integrated circuit and an integrated circuit package allowing the internal state of the integrated circuit to be monitored without the need to increase the number of terminals.

SUMMARY OF THE INVENTION

In order to address the problems noted above, the present invention provides an integrated circuit having a plurality of circuits interconnected by signal lines, and also provides an integrated circuit package having the integrated circuit. The integrated circuit includes: a monitoring-target selecting unit operable to select one of the signal lines as a monitoring target; and a radio transmitting unit operable to acquire a signal carried on the selected signal line, generate monitoring information indicative of the acquired signal, and transmit the generated monitoring information to an external device by radio (i.e., via wireless communication).

Note that the monitoring-target selecting unit is an equivalent of a setting unit 1120 described in embodiments of the present invention below. In addition, the radio transmitting unit is an equivalent of a selector 1130 in conjunction with a radio transmitter 1140 both described in the embodiments.

EFFECTS OF THE INVENTION

With the above structure, in order to monitor a selected one of the signal lines connecting the plurality of circuits, the integrated circuit transmits monitoring information that is generated based on a signal on the selected signal line to an external device by radio. That is to say, the monitoring information is output without using the terminals of the integrated circuit. Thus, the need to increase the number of terminals is eliminated.

The integrated circuit may further include a radio receiving unit operable to receive monitoring target information by radio. The monitoring target information specifies the signal line to be selected as the monitoring target. The monitoring-target selecting unit may be operable to select the signal line specified by the monitoring target information received by radio.

With the above structure, monitoring target information specifying a signal line to be selected as the monitoring target is received via radio communication. Thus, monitoring information of any signal line can be acquired. For example, the user is allowed to select any signal line to be monitored, by transmitting monitoring target information to the integrated circuit from an external device capable of radio communication with the integrated circuit.

The monitoring-target selecting unit and the radio transmitting unit may each be connected to the signal lines through a switch. The switch may be operable to be opened and closed for switching between states in which a signal on each signal line is supplied and not supplied to the monitoring-target selecting unit, the radio transmitting unit, and the radio receiving unit. The integrated circuit may further include a switch control unit operable to close the switch to allow the signals to be supplied, only if the radio receiving unit receives the monitoring target information.

With the above structure, the debugging circuit portion that includes the monitoring-target selecting unit and the radio transmitting unit is electrically connected to the integrated circuit portion, on condition that monitoring target information is received from the external device. Suppose, for example, the integrated circuit that includes the debugging circuit portion is fed power via the predetermined power supply terminal. In this case, the above structure serves to suppress disadvantages, such as voltage drop across the integrated circuit portion that would otherwise be caused as a result of feeding power to the debugging circuit portion.

The plurality of circuits may be supplied power that is received via a predetermined power supply terminal of the integrated circuit. The integrated circuit may further include a power receiving unit operable to receive power from an external device in a non-contact manner and supply the received power to the radio receiving unit, the radio transmitting unit, and the monitoring-target selecting unit.

With the above structure, the integrated circuit is enabled to feed power to the integrated circuit portion independently of the power feed to the debugging circuit portion that includes the monitoring-target selecting unit, the radio transmitting unit, and the radio receiving unit. Thus, the integrated circuit is fed power with stability. In addition, the debugging circuit portion is fed power from the external device without making any physical contact. That is, the debugging circuit portion is fed power without requiring any dedicated power supply terminal.

The monitoring-target selecting unit and the radio transmitting unit may each be connected to the signal lines through a switch. The switch may be operable to be opened and closed for switching between states in which a signal on each signal line is supplied and not supplied to the monitoring-target selecting unit, the radio transmitting unit, and the radio receiving unit. The integrated circuit may further include a switch control unit operable to close the switch only if the power receiving unit receives power.

With the above structure, the integrated circuit electrically connects the debugging circuit portion and the integrated circuit portion, on condition that power is received from a source external to the integrated circuit by radio. Thus, in the case where the integrated circuit is not debugged, adverse effects, such as a voltage drop across the integrated circuit portion, are prevented. In addition, the integrated circuit portion is reliably monitored for errors.

The radio receiving unit may be further operable to receive transmission destination information specifying a transmission destination of the monitoring target information and to determine authenticity of the transmission destination based on predetermined authentication information. The radio transmitting unit may be operable to transmit the monitoring information to the transmission destination only if the transmission destination is authenticated.

With the above structure, the radio receiving unit receives, from the external device, transmission destination information specifying a transmission destination of the monitoring information and authenticates the transmission destination. The monitoring information is transmitted to the transmission destination, on condition that authenticity of the transmission destination is established. This eliminates the risk that the monitoring information is acquired and analyzed by an unauthorized user.

REFERENCE NUMERALS

1000 Integrated Circuit
1100 Debugging Circuit Portion
1110 Radio Receiver
1120 Setting Unit
1121 Authentication Unit
1130 Selector
1131, 1132 Signal Lines
1140 Radio Transmitter
1141 Encryption Unit
1200 Monitoring-Target Circuit Portion
1210 Bus
1220 CPU
1230 Memory Controller
1300 Isolation Unit
1400 Power Supply Terminal
1500 Power Receiver
2000 External Device
2100 Instruction Transmitter
2200 Monitoring Information Receiver
2300 Power Transmitter

DETAILED DESCRIPTION OF THE INVENTION

Embodiment 1

Overview

According to the present invention, an integrated circuit includes an integrated circuit portion and a debugging circuit portion fabricated into a single package. The integrated circuit portion includes functional blocks, such as a CPU and memory, connected to one another via a bus. The debugging circuit portion monitors the bus signals as well as the operation state of the functional blocks of the integrated circuit portion. The debugging circuit portion then transmits a user-selected signal to an external device by radio.

Figure 1:
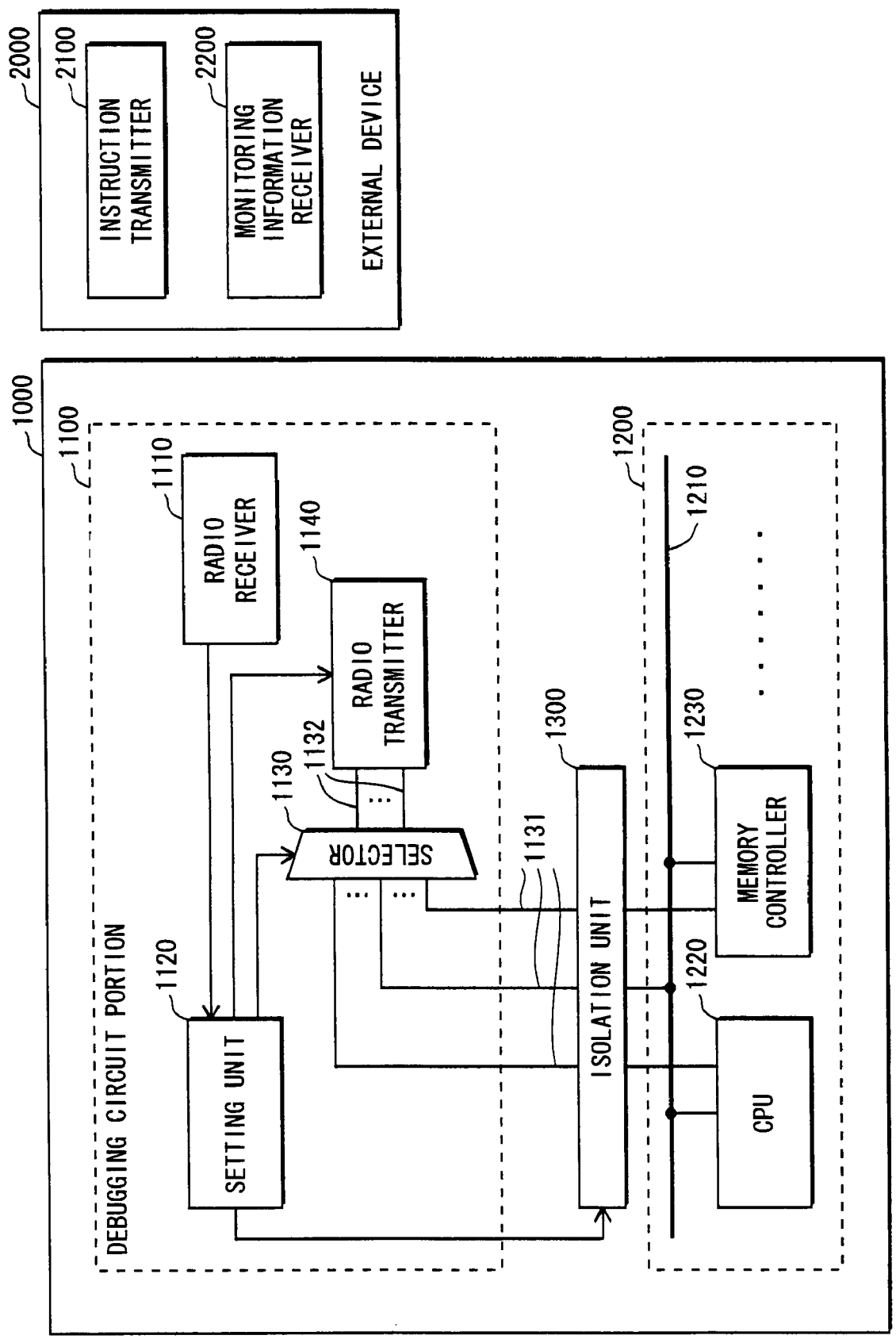
FIG. 1 is a functional block diagram of an integrated circuit and an external device according to an embodiment 1 of the present invention.

According to an embodiment 1 of the present invention, power is supplied to both the integrated circuit portion and the debugging circuit portion via a predetermined power supply terminal, which is not illustrated in the figures. As mentioned above, the integrated circuit portion includes functional blocks, such as a CPU and memory.
<Structure>
FIG. 1 is a functional block diagram of the integrated circuit according to the present invention. FIG. 1 also illustrates functional blocks of the external device.
<Overview of Integrated Circuit 1000>
As illustrated in FIG. 1, the integrated circuit 1000 includes a monitoring-target circuit portion 1200 selectable as a monitoring target, a debugging circuit portion 1100, and an isolation unit 1300. The integrated circuit 1000 is capable of radio communication with the external device 2000.

The debugging circuit portion 1100 is connected to the functional blocks of the monitoring-target circuit portion 1200 as well as to the bus 1210 by signal lines 1131 through the isolation unit 1300. That is, the isolation unit 1300 is interposed between the debugging circuit portion 1100 and the monitoring-target circuit portion 1200. Each signal line 1131 passes a signal indicative of the operation state of a connected functional block as well as a signal on the bus to the debugging circuit portion 1100.

The debugging circuit portion 1100 receives instruction information from the external device 2000. The instruction information specifies a functional block and a signal line 1131 to be monitored. Upon receipt of instruction information, the debugging circuit portion 1100 acquires the signal carried on the specified signal line 1131 and transmits the acquired signal to the external device 2000 by radio.

The following describes each unit in detail.

<Debugging Circuit Portion 1100>

The debugging circuit portion 1100 includes a radio receiver 1110, a setting unit 1120, a selector 1130, and a radio transmitter 1140.

<Radio Receiver 1110>

The radio receiver 1110 receives instruction information from the external device 2000, using a non-illustrated antenna. The instruction information specifies a functional block and/or a signal line 1131 that are requested to be monitored. Examples of the functional blocks include the CPU 1220 and the memory controller 1230. In addition, the radio receiver 1100 demodulates and A/D converts a signal indicative of the received instruction information.

Note that the instruction information may be 8-bit data pieces each specifying a functional block or a signal line of the bus to be monitored. The user is allowed to select a plurality of monitoring targets and specifies the selected monitoring targets by causing pieces of 8-bit instruction information to be sent.

<Setting Unit 1120>

The setting unit 1120 sets the selector 1130, the isolation unit 1300, and the radio transmitter 1140 according to the instruction information having been A/D converted by the radio receiver 1110.

Note that the setting unit 1120 stores in advance identification information to identify the functional blocks and the bus connected to the selector 1130. The setting unit 1120 identifies, based on the identifications information, a signal line specified by each 8-bit data piece sent as the instruction information. The setting unit 1120 then sets the selector 1130 to select the thus identified signal line as a monitoring target.

The following describes each setting.

In FIG. 1, the functional blocks of the monitoring-target circuit portion 1200 and the bus 1210 are connected by the signal lines 1131 to the selector 1130 through the isolation unit 1300. The setting unit 1120 sets the selector 1130 to select the signal line 1131 connected to each of the functional blocks and bus that is specified by the instruction information.

In addition, the setting unit 1120 opens and closes the switch of the isolation unit 1300, according to whether instruction information is received from the external device 2000 via the radio receiver 1110.

Further, the setting unit 1120 sets the radio transmitter 1140, so that a signal carried on each signal line 1131 selected by the selector 1130 is transmitted by radio to the external device 2000.

<Selector 1130>

The selector 1130 selects one or more signal lines 1131 according to each monitoring target set by the setting unit 1120. The selector 1130 then causes a signal on the selected signal line 1132 to be supplied to the radio transmitter 1140.

<Radio Transmitter 1140>

The radio transmitter 1140 generates monitoring information from the signal supplied from the selected signal line 1132. The radio transmitter 1140 then performs D/A conversion and modulation on the monitoring information. The monitoring information is transmitted by radio at predetermined intervals, using a non-illustrated antenna to the external device 200.

<Isolation Unit 1300>

The isolation unit 1300 is embodied by a transistor, for example. The isolation unit 1300 opens and closes the switch according to the setting made by the setting unit 1120. With the switch closed, the isolation unit 1300 makes the electrical connection between the selector 1120 and the respective signal lines 1131, so that a signal on each signal line 1131 is supplied to the selector 1130. With the switch opened, the isolation unit 1300 breaks the electrical connection between the selector 1120 and the respective signal lines 1131, so that a signal on the signal line 1131 is not supplied to the selector 1130.

<Monitoring-Target Circuit Portion 1200>

The monitoring-target circuit portion 1200 includes the functional blocks, such as the CPU 1220 and the memory controller 1230, that are connected to the bus 1210. These functional blocks are built into the integrated circuit by the user for carrying out the primary purpose of the integrated circuit, such as image processing and communications.

According to the present embodiment, the value held in a specific register that is selected by the user is output as the internal state of the CPU 1220, which is a functional block. In addition, the value held at a specific memory address that is selected by the user is output as the internal state of the memory controller 1230.

<External Device 2000>

The external device 2000 includes an instruction transmitter 2100 and a monitoring information receiver 2200.

The instruction transmitter 2100 conducts D/A conversion and modulation on instruction information and transmits the resulting instruction information to the integrated circuit 1000 by radio. The instruction information specifies one or more of the functional blocks and signal lines of the integrated circuit 1000 selected by a user operation to be monitored.

The monitoring information receiver 2200 has an antenna and receives monitoring information from the integrated circuit 1000 by radio using the antenna. The monitoring information indicates the operation state of the functional block being a monitoring target and/or the signal on the signal line being a monitoring target.

<Operation>

The following describes the operation of the integrated circuit 1000 according to the present invention.

Figure 2:
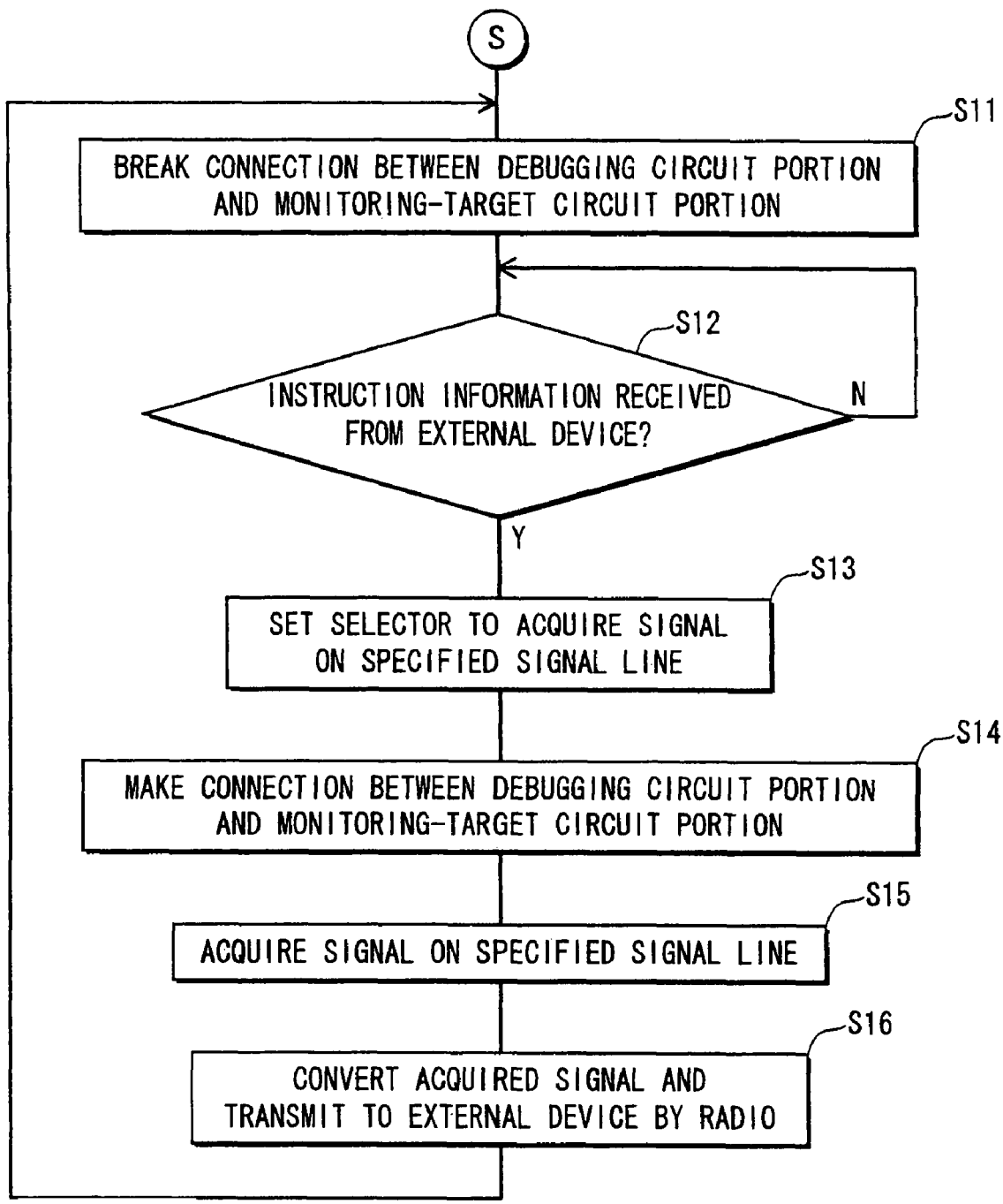
FIG. 2 is a flowchart showing operation of the integrated circuit according to the embodiment 1.

FIG. 2 is a flowchart showing the operation of the integrated circuit 1000 according to the present embodiment.

In Step S11, the setting unit 1120 sets the switch of the isolation unit 1300 to the open position, so that no signals are fed from the monitoring-target circuit portion 1200 to the selector 1130 via the signal lines 1131.

Next, in Step S12, it is judged whether the radio receiver 1110 receives instruction information from the external device 2100. Upon receipt, the radio receiver 1110 demodulates the received instruction information and supplies the resulting instruction information to the setting unit 1120 (Step S12:Y).

Following Step, S12, the setting unit 1120 sets the selector 1130 to select the signal line 1131 that is connected to each monitoring target specified by the instruction information. In addition, the setting unit 1120 sets the radio transmitter 1140 to transmit the signal carried on the selected signal line 1132 to the external device 2000 by radio (Step S13).

Next, the setting unit 1120 sets the switch of the isolation unit 1300 to the close position, so that signals on the respective signal lines 1131 are fed to the selector 1130 (Step S14).

Next, the selector 1130 selectively acquires a signal on each signal line 1131 that is selected according to the setting made by the setting unit 1120 and supplies the acquired signal to the radio transmitter 1140 (Step S15).

The radio transmitter 1140 acquires the signal on the selected signal line 1132, generates monitoring information indicative of whether the signal is HIGH or LOW, and transmits the monitoring information to the external device 2000 (Step S16). More specifically, for example, the monitoring information may indicate "0" when the acquired signal is at low level and "1" at high level.

The monitoring information receiver 2200 of the external device 2000 receives the monitoring information transmitted by the radio transmitter 1140.

In Step S12, if the radio receiver 1110 has not received instruction information from the external device 2000 (Step S12:N), the setting unit 1120 keeps the switch of isolation unit 1300 at the open position until the radio receiver 1110 receives instruction information.

With the above structure, the integrated circuit is enabled to output the monitoring information to the external device without using any of the terminals, which is limited in number. In addition, the electrical connection is established between the monitoring-target circuit portion and the debugging circuit portion only when an instruction for debugging is received from the external device. In the connected state, a signal on the signal line 1131 that is connected to the monitoring target is supplied to the debugging circuit portion 1100. That is to say, during the normal state in which no debugging is conducted, the voltage drop across the functional blocks due to the electrical connection with the debugging circuit is prevented.

Embodiment 2

According to the embodiment 1 described above, power is supplied to the debugging circuit portion 1100 as well as to the monitoring-target circuit portion 1200 via the predetermined power supply terminal. According to an embodiment 2 of the present invention, the monitoring-target circuit portion 1200 is supplied power via a predetermined power supply terminal but the debugging circuit portion 1100 is supplied power from an external device.

Figure 3:
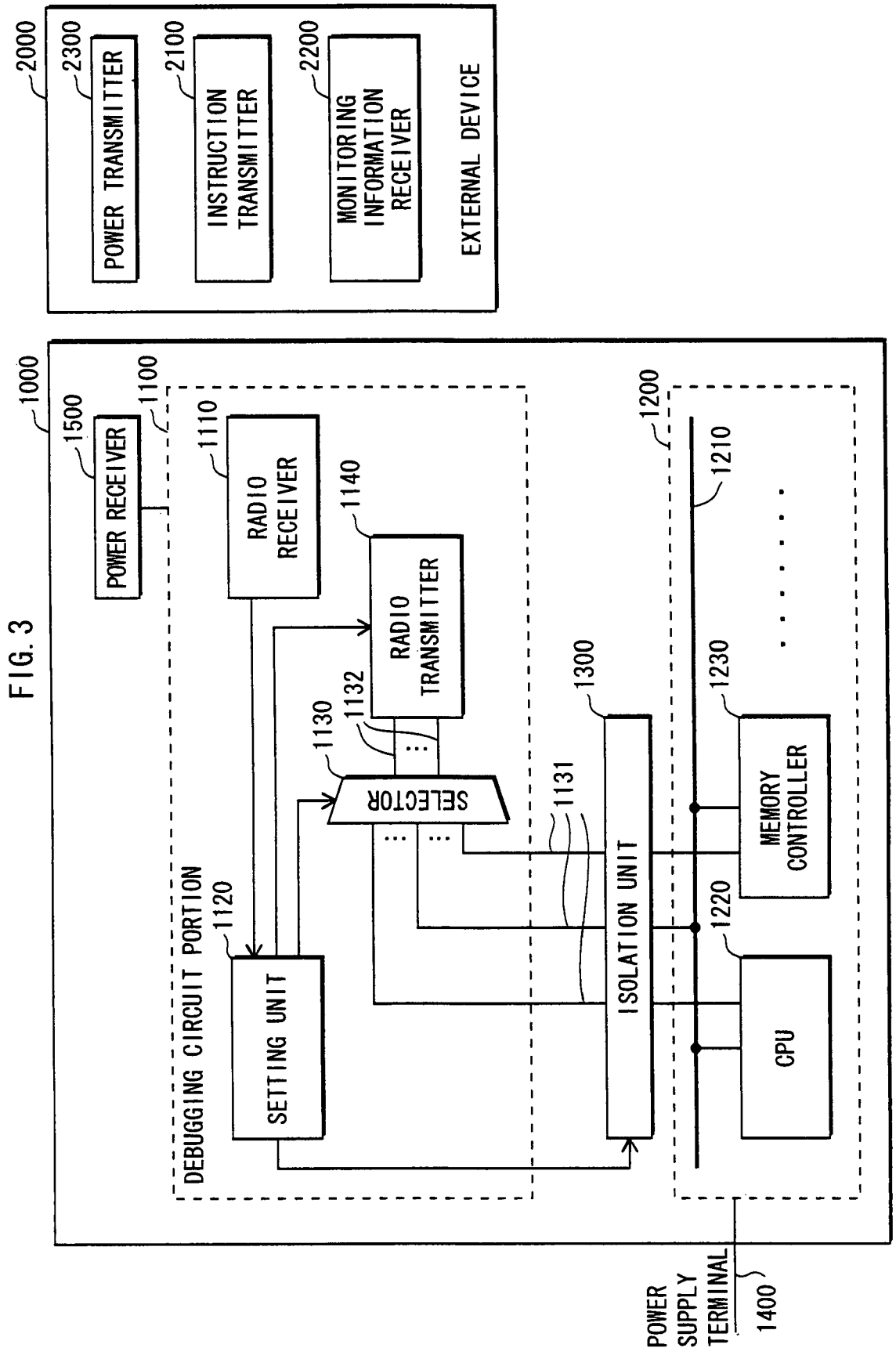
FIG. 3 is a functional block diagram of an integrated circuit according to an embodiment 2 of the present invention.

FIG. 3 is a functional block diagram of the integrated circuit 1000 according to the present embodiment.

According to the present embodiment, the monitoring-target circuit portion 1200 of the integrated circuit 1000 is supplied power via a power supply terminal 1400, whereas the debugging circuit portion 1100 is supplied power from the external device 2000 in a non-contact manner.

In addition, the setting unit 1120 sets the switch of the isolation unit 1300 to the close position, on condition that power is supplied from the external device 2000. With the switch closed, signals are supplied to the debugging circuit portion 1100.

<Structure>

In the embodiment 2, the same reference numerals have been applied to components identical to the embodiment 1. The following describes components that differ from the embodiment 1.

The integrated circuit 1000 additionally includes a power receiver 1500. The external device 2000 additionally includes a power transmitter 2300.

The power receiver 1500 receives power transmitted from the external device 2000 and supplies the received power to the debugging circuit portion 1100.

The setting unit 1120 opens and closes the switch of the isolation unit 1300 according to whether the power receiver 1500 is receiving power.

The power transmitter 2300 supplies power to the integrated circuit 2000 without making physical contact.

According to the present embodiment, the power transmitter 2300 and the power receiver 1500 both include a coil. In order to supply power to the power receiver 1500, the external device 2000 feeds electric current to the coil of the power transmitter 2300. When the coil through which electric current is flowing is placed closer to the coil of the power receiver 1500, mutual induction is caused between the two coils. As a result, the power receiver 1500 receives power.

<Operation>

The following describes the operation of the integrated circuit 1000 according to the present embodiment.

Figure 4:
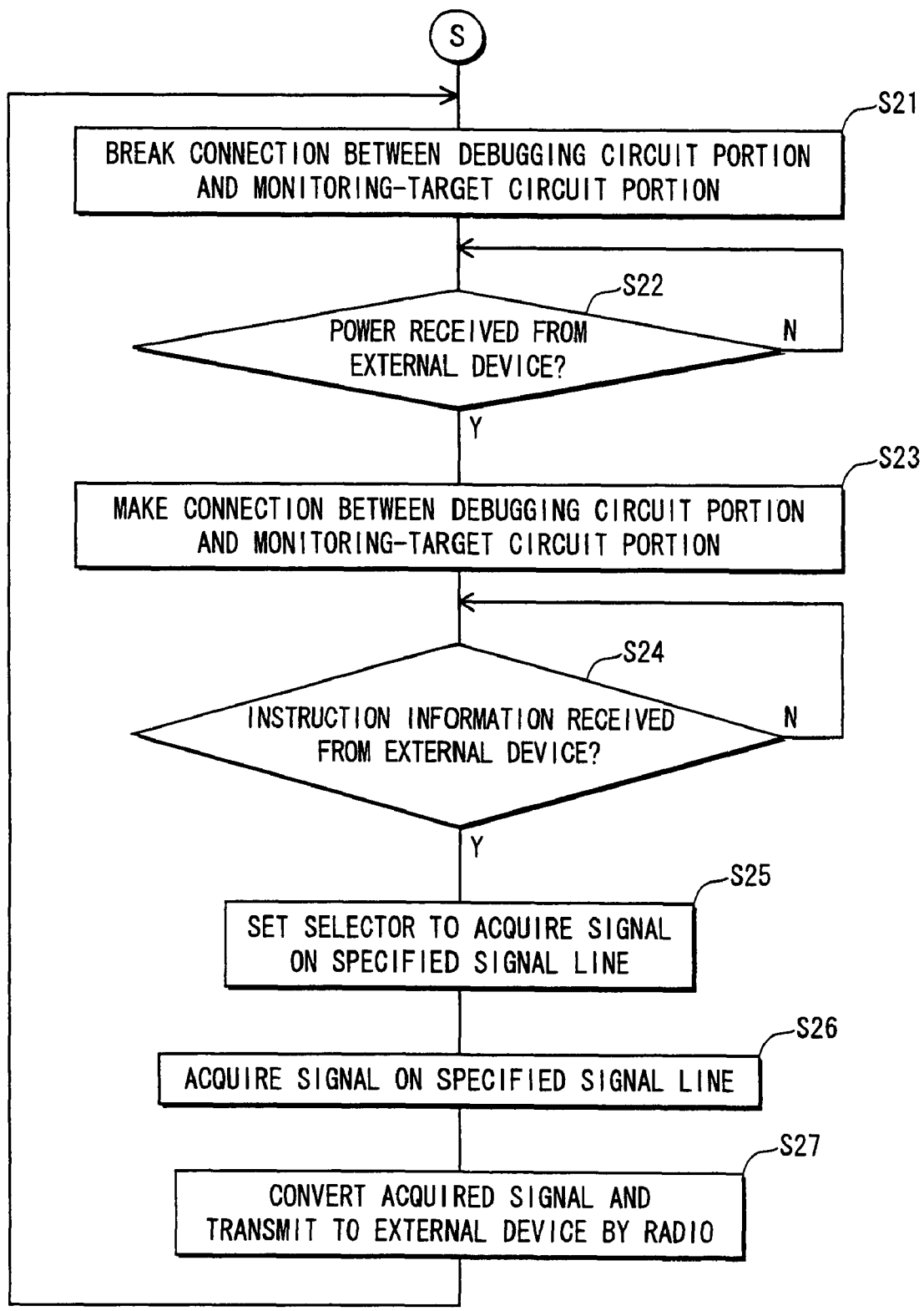
FIG. 4 is a flowchart of operation of the integrated circuit according to the embodiment 2.

FIG. 4 is a flowchart of operation of the integrated circuit 1000.

Hereinafter, a description is given of specific steps that are different from the embodiment 1.

Similarly to the embodiment 1, the setting unit 1120 sets the switch of the isolation unit 1300 to the open position, thereby allowing no signal to be supplied to the debugging circuit portion 1100 (Step S21).

If the power receiver 1500 receives power from the power transmitter 2300 of the external device 2000 (Step S22: Y), the setting unit 1120 changes the switch of the isolation unit 1300 to the close position, thereby allowing signals to be supplied to the debugging circuit portion 1100 (Step S23).

Next, if the radio receiver 1110 receives instruction information from the instruction transmitter 2100 of the external device 2000 (Step S24: Y), the setting unit 1120 sets the selector 1130 to select the signal line 1131 connected to the monitoring target that is specified in the received instruction information. In addition, the setting unit 1120 sets the radio transmitter 1140 to transmit the signal on the selected signal line 1132 to the external device 2000 by radio. (Step S25)

The operation performed in Step S26 and onward is identical to the embodiment 1.

Note that if it is judged in Step S22 that the power receiver 1500 is not receiving power (Step S22:N), the setting unit 1120 keeps the switch of the, isolation unit 1300 at the open position until the power receiver 1500 starts to receive power. Thus, no signal on the signal line 1311 is supplied to the selector 1130 during that time.

In addition, if it is judged in Step S24 that the radio receiver 1110 has not received instruction information (Step S24:N), the setting unit 1120 does not make setting of the selector 1130 until instruction information is received.

With the above structure, the debugging circuit portion 1100 and the monitoring-target circuit portion 1200 are separately fed power from separate sources. Thus, stable power supply to the monitoring-target circuit portion 1200 is ensured. This prevents the risk of failing to acquire accurate debugging information due, for example, to the voltage drop across the functional blocks of the monitoring-target circuit portion 1200.

Embodiment 3

According to the embodiments 1 and 2, in response to instruction information received from the external device 2000, the integrated circuit 1000 transmits monitoring information to the external device 2000 without authenticating whether the external device 2000 is an authorized transmission destination of monitoring information.

According to an embodiment 3 of the present invention, the integrated circuit 1000 determines whether the external device 2000 is an authorized transmission destination. Monitoring information is transmitted in encrypted form to the external device on condition that the external device 2000 is authenticated.

<Structure>

Figure 5:
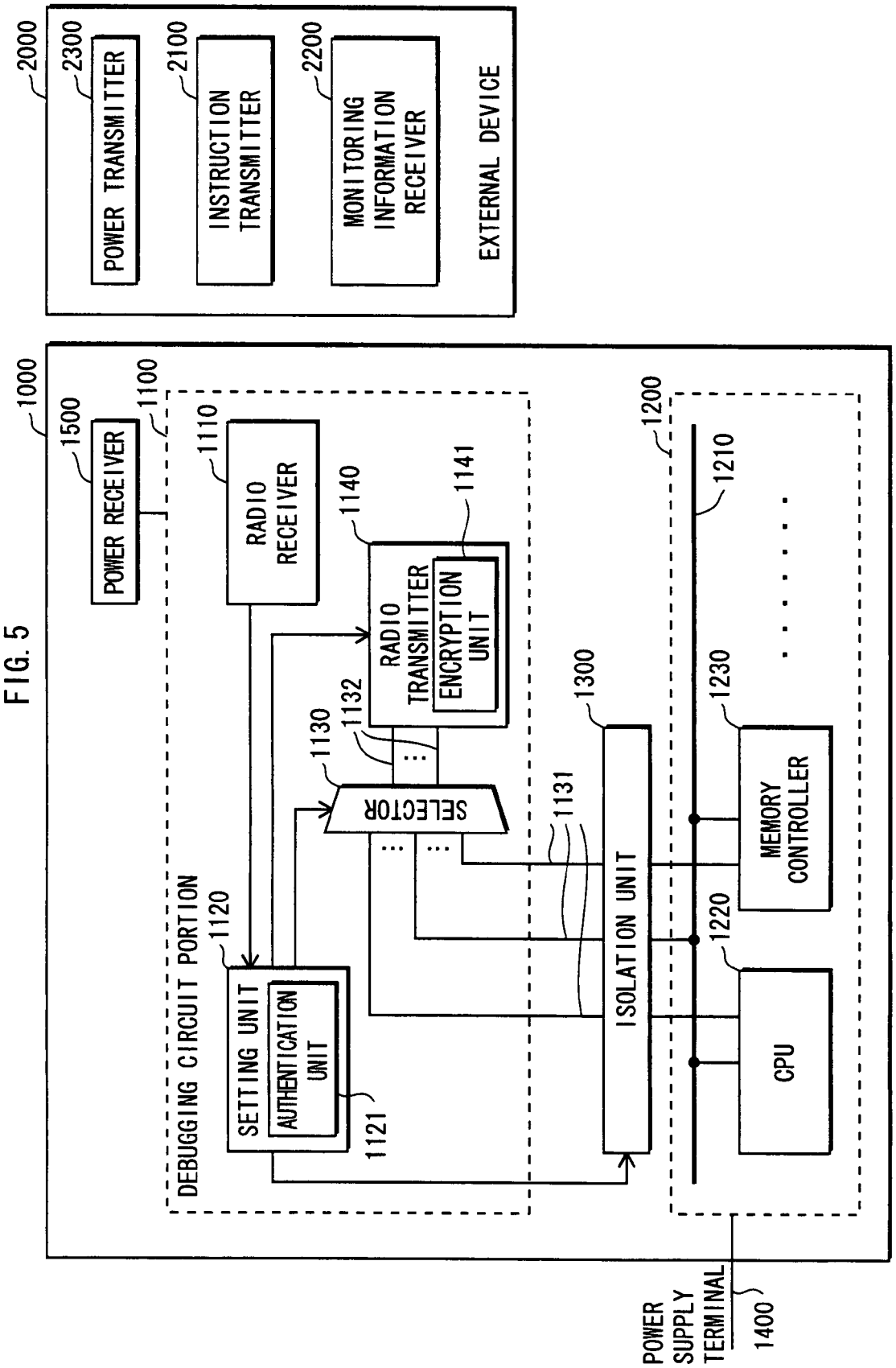
FIG. 5 is a functional block diagram of an integrated circuit according to an embodiment 3 of the present invention.

FIG. 5 is a functional block diagram of the integrated circuit 1000 according to the embodiment 3.

The following describes the difference in structure between the embodiments 1 and 2.

The setting unit 1120 includes an authentication unit 1121. In addition, the radio transmitter 1140 includes an encryption unit 1141.

The authentication unit 1121 stores in advance authentication information in memory, for example. The authentication information may be IDs and passwords allotted to transmission destinations. The integrated circuit 1000 receives instruction information from the external device 2000, along with transmission destination information indicating, for example, an ID or password of the external device. The authentication unit 1121 then determines the authenticity of the external device 2000 with reference to the stored authentication information.

The setting unit 1120 sets the selector 1130 and the radio transmitter 1140, in accordance with the result of authentication of the external device 2000 by the authentication unit 1121.

The encryption unit 1141 encrypts monitoring information supplied via each signal line 1132 selected. The encryption is carried out using a suitable cryptographic technique selected in accordance with the setting of the radio transmitter 1140 made by the setting unit 1120. Examples of cryptographic techniques include public key cryptography and secret key cryptography.

According to the external device 2000 of the present embodiment, the instruction transmitter 2100 transmits instruction information and transmission destination information to the integrated circuit 1000. The transmission destination information includes an ID or a password unique to the external device 2000.

<Operation>

Figure 6:
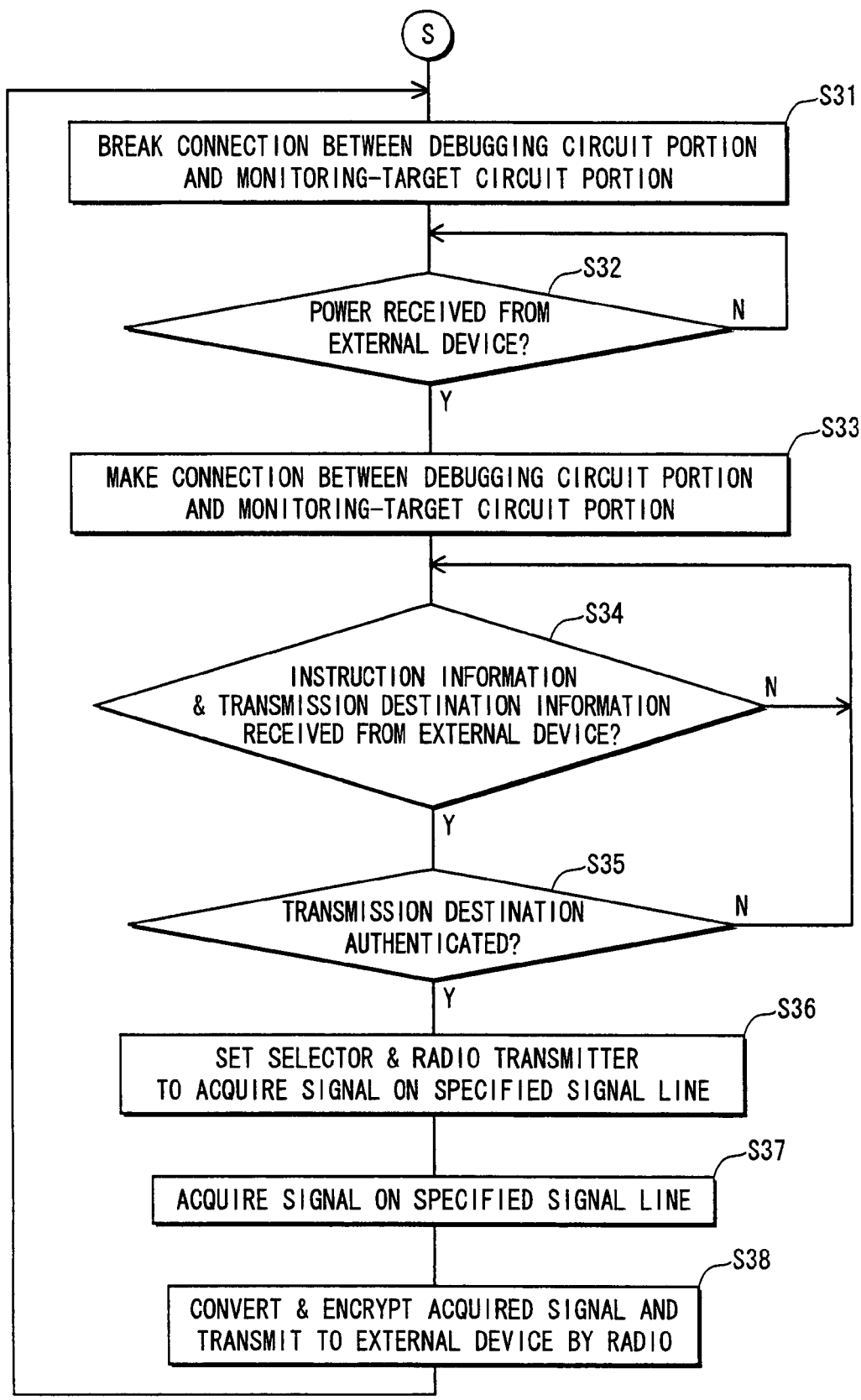
FIG. 6 is a flowchart showing operation of the integrated circuit according to the embodiment 3.

FIG. 6 is a flowchart showing operation of the integrated circuit 1000 according to the present embodiment.

The following describes operation that are different from the embodiments 1 and 2 above.

In Step S34, the radio receiver 1110 receives instruction information and transmission destination information from the external device 2000 (Step S34:Y). In response, the authentication unit 1121 determines authenticity of the external device 2000 based on the authentication information and the transmission destination information (Step S35).

If the external device 2000 is authenticated (Step S35:Y), the setting unit 1120 sets the selector 1130 to select each signal line specified by the instruction information. In addition, the setting unit 1120 sets the radio transmitter 1140 to transmit the signal fed from the signal line 1132 to the external device 2000 by radio (Step S36).

Similarly to the embodiments 1 and 2, Step S37 is performed after Step S36. In Step S38, the encryption unit 1141 encrypts and modulates the signal fed from each selected signal line 1132 to generate monitoring information. The radio transmitter 1140 transmits the thus generated monitoring information to the external device 2000 by radio.

If the external device 2000 is not authenticated in Step S35 (Step S35:N), Step S34 is performed again.

<Supplemental Note>

Up to this point, the present invention has been described by way of the above embodiments. It should be appreciated, however, that the present invention is not limited to the specific embodiments described above. Various modifications including the following still fall within the scope of the present invention.

(1) According to the above embodiments, instruction information specifying a signal line to be monitored is received from the external device 2000. The setting unit 1120 then sets the selector 1130 to select the signal line specified by the received instruction information. Alternatively, the selector 1130 may be set in advance to select a specific signal line to be monitored. Alternatively, such setting may be made by software running on a processor included in the integrated circuit. Alternatively, such setting may be made in accordance with the state of terminals of the integrated circuit.

(2) According to the embodiment 2 above, the debugging circuit portion 1100 of the integrated circuit 1000 is supplied power from the external device 2000 in a non-contact manner. Alternatively, the power may be supplied via a physical contact with the external device 2000.

(3) According to the above embodiments, the debugging circuit portion 1100 of the integrated circuit 1000 includes the radio receiver 1110 and the radio transmitter 1140 as circuit components. In the case where the integrated circuit is for performing a communication function, a circuit portion included in the integrated circuit for implementing the radio communication may also be used as the radio receiver 1110 and the radio transmitter 1140.

According to the embodiments above, the radio receiver 1110 and the radio transmitter 1140 are separate components. Alternatively, the radio receiver and transmitter may be a single component.

(4) According to the embodiments 1 and 2 above, the isolation unit 1300 is set according to the instruction information received from the external device 2000 or to the state of power reception. Alternatively, such setting may be made by software running on a processor included in the integrated circuit.

Figure 7:
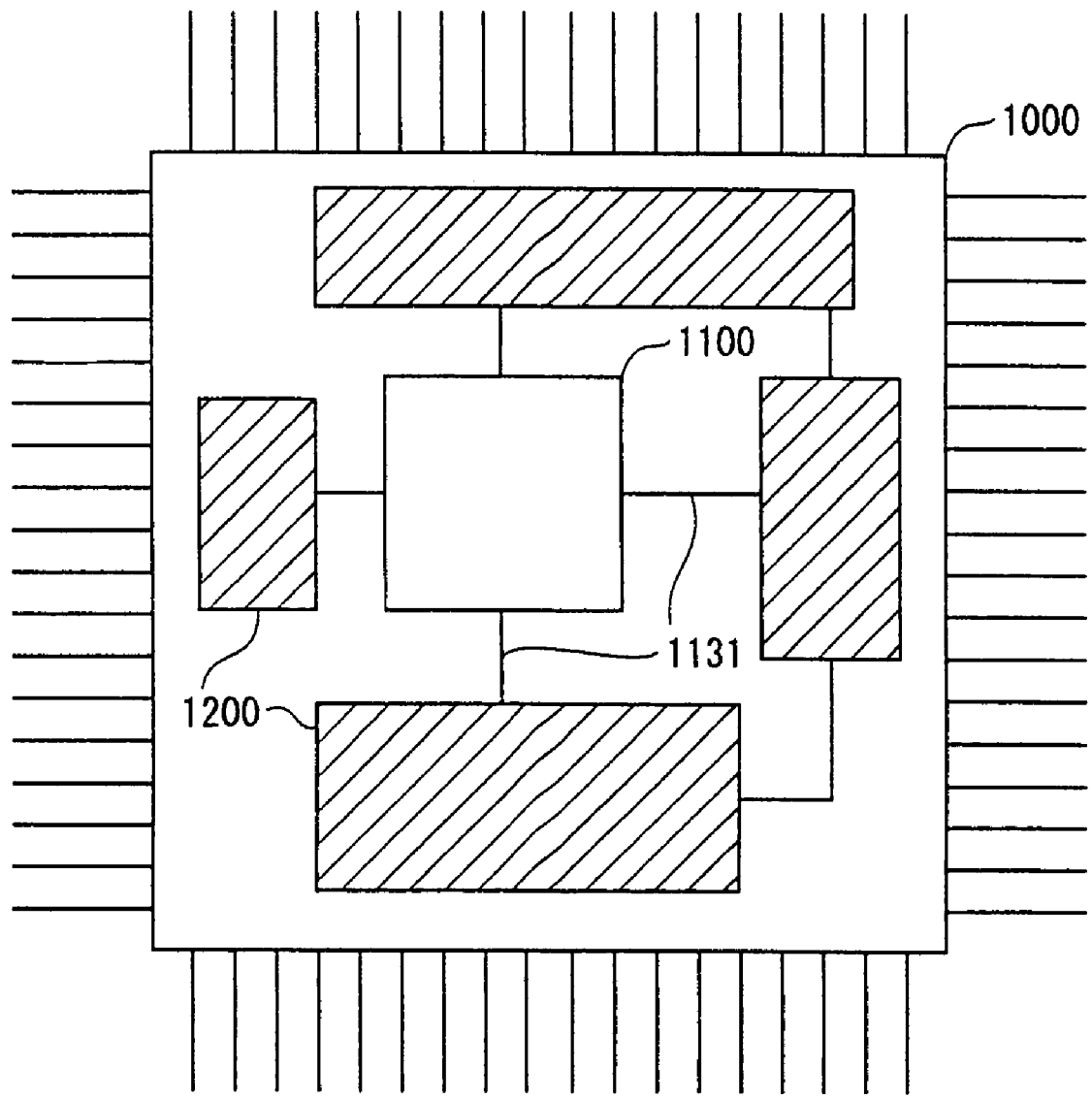
FIG. 7 is a conceptual illustration of the integrated circuit package.

(5) It is preferable that the debugging circuit portion 1100 of the integrated circuit 1000 is located generally in the center of the integrated circuit package, as illustrated in FIG. 7. This arrangement makes it easier to wire the signal lines 1131 connecting the debugging circuit portion 1100 to components of the integrated circuit portion 1200 which are selectable as monitoring targets.

(6) According to the embodiments above, each piece of instruction information is an 8-bit data piece specifying a functional block or a signal line to be monitored. However, instruction information is not limited to such and may be any number of bits.

(7) According to each embodiment above, the integrated circuit includes the monitoring-target circuit portion and the debugging circuit portion. The integrated circuit may be fabricated as a single integrated circuit package.

(8) The present invention may be embodied as a method that include the steps described in any of the above embodiments. Further, the present invention may be embodied as a computer program for causing a computer system to execute the method. Still further, the present invention may be embodied as a digital signal representing the program.

Still further, the present invention may be embodied as a computer-readable recording medium storing the computer program or digital signal mentioned above. Examples of computer-readable recording media includes a flexible disk, hard disk, CD, MO, DVD, BD, and semiconductor memory.

Still further, the present invention may be embodied as the computer program or digital signal that is transmitted via a telecommunication network, a wireless or wired communication network, or a network typified by the Internet.

Still further, the program or digital signal mentioned above may be transferred in the form of a recording medium mentioned above, or via a network mentioned above, so that the program or digital signal may be executed by another independent computer system.

INDUSTRIAL APPLICABILITY

The integrated circuit package and integrated circuit according to the present invention are usable for electronic products, typified by mobile phones and home appliances.

The invention claimed is:

1. An integrated circuit including a plurality of circuits interconnected by a plurality of signal lines, comprising:
 a monitoring-target selecting unit operable to select one of the plurality of signal lines as a monitoring target; and
 a radio transmitting unit operable to acquire a signal carried on the selected one of the plurality of signal lines, to generate monitoring information indicative of the acquired signal, and to transmit the generated monitoring information to an external device by radio.

2. The integrated circuit according to claim 1, further comprising:
 a radio receiving unit operable to receive monitoring target information by radio, the monitoring target information specifying the one of the plurality of signal lines to be selected as the monitoring target,
 wherein the monitoring-target selecting unit is operable to select the one of the plurality of signal lines specified by the monitoring target information received by radio.

3. The integrated circuit according to claim 1, wherein the plurality of circuits are supplied power that is received via a predetermined power supply terminal of the integrated circuit,
 the integrated circuit further comprising:
 a power receiving unit operable to receive power from an external device in a non-contact manner and to supply the received power to the radio receiving unit, the radio transmitting unit, and the monitoring-target selecting unit.

4. The integrated circuit according to claim 2, wherein:
 the radio receiving unit is further operable to receive transmission destination information specifying a transmission destination of the monitoring target information, and to determine authenticity of the transmission destination based on predetermined authentication information, and
 the radio transmitting unit is operable to transmit the monitoring information to the transmission destination only if the transmission destination is authenticated.

5. An integrated circuit including a plurality of circuits interconnected by a plurality of signal lines, comprising:
 a monitoring-target selecting unit operable to select one of the plurality of signal lines as a monitoring target; and
 a radio transmitting unit operable to acquire a signal carried on the selected one of the plurality of signal lines, to generate monitoring information indicative of the acquired signal, and to transmit the generated monitoring information to an external device by radio;
 wherein the plurality of circuits are supplied power that is received via a predetermined power supply terminal of the integrated circuit,
 the integrated circuit further comprising:
 a power receiving unit operable to receive power from an external device in a non-contact manner and to supply the received power to the radio receiving unit, the radio transmitting unit, and the monitoring-target selecting unit;
 wherein the monitoring-target selecting unit and the radio transmitting unit are each connected to the signal lines through a switch,
 wherein the switch is operable to be opened and closed for switching between states in which a signal on each signal line is supplied and not supplied to the monitoring-target selecting unit, the radio transmitting unit, and the radio receiving unit,
 the integrated circuit further comprising:
 a switch control unit operable to close the switch only if the power receiving unit receives power.

6. An integrated circuit including a plurality of circuits interconnected by a plurality of signal lines, comprising:
 a monitoring-target selecting unit operable to select one of the plurality of signal lines as a monitoring target;
 a radio transmitting unit operable to acquire a signal carried on the selected one of the plurality of signal lines, to generate monitoring information indicative of the acquired signal, and to transmit the generated monitoring information to an external device by radio; and
 a radio receiving unit operable to receive monitoring target information by radio, the monitoring target information specifying the one of the plurality of signal lines to be selected as the monitoring target,
 wherein the monitoring-target selecting unit is operable to select the one of the plurality of signal lines specified by the monitoring target information received by radio;
 wherein the monitoring-target selecting unit and the radio transmitting unit are each connected to the signal lines through a switch, and
 wherein the switch is operable to be opened and closed for switching between states in which a signal on each signal line is supplied and not supplied to the monitoring-target selecting unit, the radio transmitting unit, and the radio receiving unit,
 the integrated circuit further comprising:
 a switch control unit operable to close the switch to allow the signals to be supplied, only if the radio receiving unit receives the monitoring target information.

7. An integrated circuit package including a plurality of circuits interconnected by a plurality of signal lines, comprising:
 a monitoring-target selecting unit operable to select one of the plurality of signal lines as a monitoring target; and
 a radio transmitting unit operable to acquire a signal carried on the selected one of the plurality of signal lines, to generate monitoring information indicative of the acquired signal, and to transmit the generated monitoring information to an external device by radio.

8. A non-transitory recording medium storing a control program executable by a device to perform a process of causing an integrated circuit to output a signal to an external device, the integrated circuit including a plurality of circuits interconnected by a plurality of signal lines, the control program comprising code operable to cause the device to perform:

a target selecting step of selecting one of the plurality of signal lines as a monitoring target; and a transmitting step of acquiring a signal carried on the selected one of the plurality of signal lines, generating monitoring information indicative of the acquired signal, and transmitting the generated monitoring information to an external device by radio.

* * * * *